United States Patent
Kobayashi et al.

(10) Patent No.: US 10,563,296 B2
(45) Date of Patent: Feb. 18, 2020

(54) COATED STEEL

(71) Applicant: NIPPON STEEL & SUMITOMO METAL CORPORATION, Tokyo (JP)

(72) Inventors: Akinobu Kobayashi, Tokyo (JP); Kohei Tokuda, Tokyo (JP); Nobuyuki Shimoda, Tokyo (JP); Yasuto Goto, Tokyo (JP); Kenichiro Matsumura, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 0 days.

(21) Appl. No.: 15/752,734

(22) PCT Filed: Sep. 29, 2016

(86) PCT No.: PCT/JP2016/078935
§ 371 (c)(1),
(2) Date: Feb. 14, 2018

(87) PCT Pub. No.: WO2017/057639
PCT Pub. Date: Apr. 6, 2017

(65) Prior Publication Data
US 2018/0237900 A1  Aug. 23, 2018

(30) Foreign Application Priority Data
Sep. 29, 2015  (JP) .................. 2015-191856

(51) Int. Cl.
C23C 14/16  (2006.01)
B32B 15/01  (2006.01)
(Continued)

(52) U.S. Cl.
CPC .............. C23C 14/16 (2013.01); B32B 15/01 (2013.01); B32B 15/012 (2013.01);
(Continued)

(58) Field of Classification Search
CPC ..... B32B 15/012; B32B 15/013; B32B 15/04; B32B 15/043; B32B 15/18; B32B 15/01;
(Continued)

(56) References Cited

U.S. PATENT DOCUMENTS

| 8,337,998 B2 | 12/2012 | Takeda et al. |
| 2010/0018612 A1 | 1/2010 | Tokuda et al. |
| 2012/0129001 A1 | 5/2012 | Schuhmacher et al. |

FOREIGN PATENT DOCUMENTS

| JP | 64-21064 A | 1/1989 |
| JP | 64-21066 A | 1/1989 |

(Continued)

OTHER PUBLICATIONS

International Search Report for PCT/JP2016/078935 dated Dec. 20, 2016.
(Continued)

*Primary Examiner* — Michael E. La Villa
(74) *Attorney, Agent, or Firm* — Birch, Stewart, Kolasch & Birch, LLP

(57) ABSTRACT

The invention provides a coated steel including a steel, a coated metal layer coated on a surface of the steel, and an interfacial alloy layer formed at the boundary between the steel and the coated metal layer, in which the coated metal layer has a predetermined composition and structure, and in which the thickness of the coated metal layer is 0.1 μm or more, and the thickness of the interfacial alloy layer is 500 nm or less.

6 Claims, 2 Drawing Sheets

(51) Int. Cl.

| | |
|---|---|
| *C22C 21/00* | (2006.01) |
| *C22C 23/02* | (2006.01) |
| *C22C 18/00* | (2006.01) |
| *C22C 23/04* | (2006.01) |
| *C22C 30/06* | (2006.01) |
| *C23C 14/30* | (2006.01) |
| *C23C 14/02* | (2006.01) |
| *C22C 21/06* | (2006.01) |
| *C22C 21/10* | (2006.01) |
| *C22C 23/00* | (2006.01) |
| *C23C 14/14* | (2006.01) |
| *C23C 2/06* | (2006.01) |
| *C23C 28/02* | (2006.01) |
| *C23C 2/04* | (2006.01) |
| *C23C 2/12* | (2006.01) |
| *B32B 15/04* | (2006.01) |
| *C23C 30/00* | (2006.01) |
| *B32B 15/18* | (2006.01) |
| *C22C 18/04* | (2006.01) |

(52) U.S. Cl.
CPC .......... *B32B 15/013* (2013.01); *B32B 15/017* (2013.01); *B32B 15/04* (2013.01); *B32B 15/043* (2013.01); *B32B 15/18* (2013.01); *C22C 18/00* (2013.01); *C22C 18/04* (2013.01); *C22C 21/00* (2013.01); *C22C 21/06* (2013.01); *C22C 21/10* (2013.01); *C22C 23/00* (2013.01); *C22C 23/02* (2013.01); *C22C 23/04* (2013.01); *C22C 30/06* (2013.01); *C23C 2/04* (2013.01); *C23C 2/06* (2013.01); *C23C 2/12* (2013.01); *C23C 14/021* (2013.01); *C23C 14/14* (2013.01); *C23C 14/165* (2013.01); *C23C 14/30* (2013.01); *C23C 28/021* (2013.01); *C23C 28/023* (2013.01); *C23C 28/025* (2013.01); *C23C 30/00* (2013.01); *C23C 30/005* (2013.01); *B32B 2311/20* (2013.01); *B32B 2311/24* (2013.01); *B32B 2311/30* (2013.01); *Y10T 428/12729* (2015.01); *Y10T 428/12757* (2015.01); *Y10T 428/12799* (2015.01); *Y10T 428/12958* (2015.01); *Y10T 428/12965* (2015.01); *Y10T 428/12972* (2015.01); *Y10T 428/2495* (2015.01); *Y10T 428/24967* (2015.01); *Y10T 428/24975* (2015.01); *Y10T 428/263* (2015.01); *Y10T 428/264* (2015.01); *Y10T 428/265* (2015.01)

(58) Field of Classification Search
CPC ............... B32B 15/017; B32B 2311/20; B32B 2311/24; B32B 2311/30; C23C 14/14; C23C 14/16; C23C 23/02; C23C 2/04; C23C 2/06; C23C 2/12; C23C 14/165; C23C 28/021; C23C 28/023; C23C 28/025; C23C 30/00; C23C 30/005; C23C 14/021; C23C 14/30; C22C 18/00; C22C 21/00; C22C 18/04; C22C 30/06; C22C 23/04; C22C 23/02; C22C 21/10; C22C 21/06; C22C 23/00; Y10T 428/2495; Y10T 428/24967; Y10T 428/24975; Y10T 428/263; Y10T 428/264; Y10T 428/265; Y10T 428/12958; Y10T 428/12965; Y10T 428/12972; Y10T 428/12799; Y10T 428/12757; Y10T 428/12729
See application file for complete search history.

(56) References Cited

FOREIGN PATENT DOCUMENTS

| | | |
|---|---|---|
| JP | 7-268604 A | 10/1995 |
| JP | 2008-255464 A | 10/2008 |
| JP | 2011-190507 A | 9/2011 |
| JP | 2012-528247 A | 11/2012 |
| WO | WO 2012/091385 A2 | 7/2012 |

OTHER PUBLICATIONS

Written Opinion of the International Searching Authority for PCT/JP2016/078935 (PCT/ISA/237) dated Dec. 20, 2016.

Indian Office Action and Search Report, dated Jun. 28, 2019, for corresponding Indian Application No. 201817004431, with an English translation.

[Fig. 1]
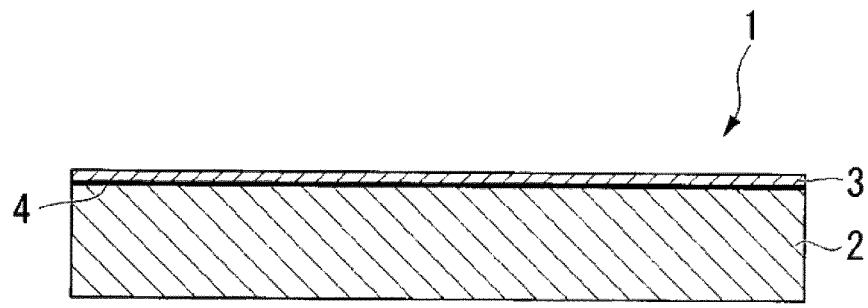
[Fig. 2]
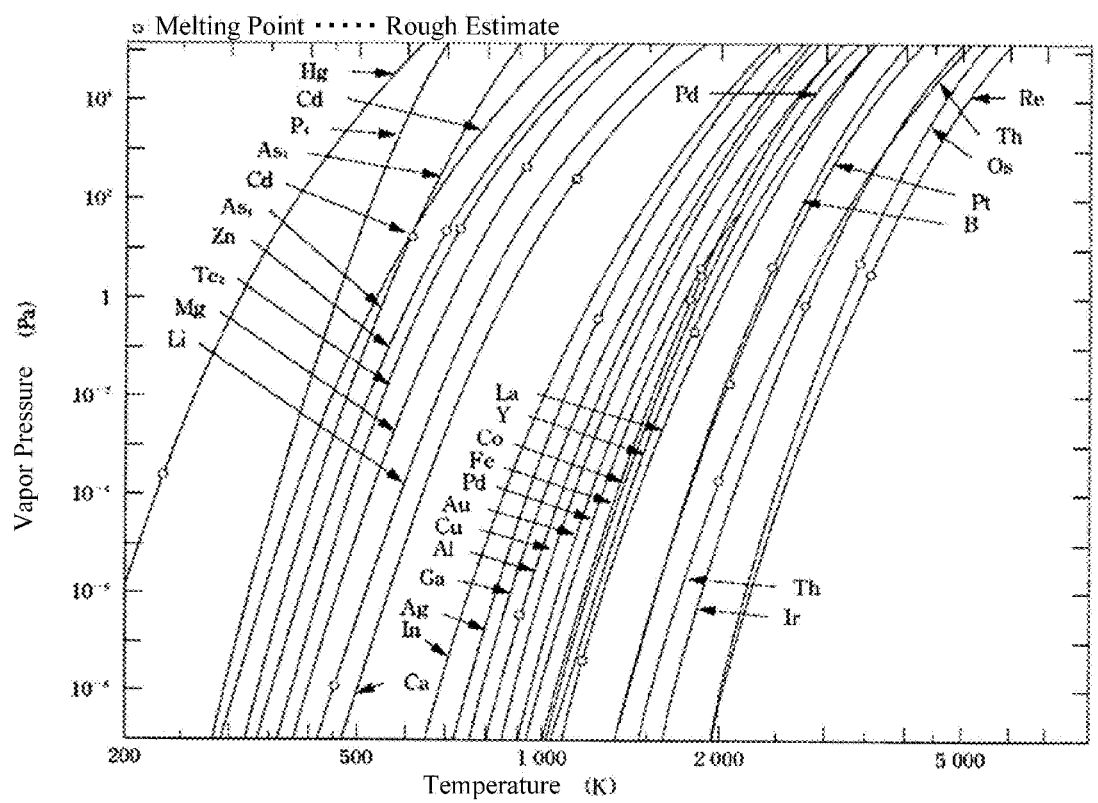

[Fig. 3]
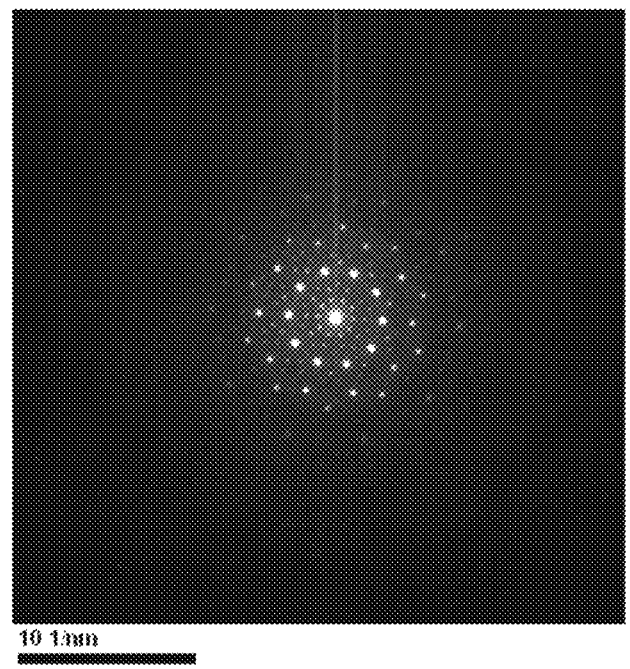

COATED STEEL

TECHNICAL FIELD

The present disclosure relates to a coated steel.

BACKGROUND ART

Improvement of the corrosion resistance of steels by coating the steel surface with a metal such as Zn has been heretofore conducted. Steels coated with Zn, Zn—Al, Zn—Al—Mg, Al—Si, or the like are produced presently. With respect to coatings on steels, not only corrosion resistance but also abrasion resistance, or high adhesion after processing are demanded frequently. As methods of coating steels, hot dip metal coating methods, which are suitable for mass production, are widely used.

The corrosion resistance demanded for a coating on a steel has been yearly getting higher, and a coating with a Mg content higher than before has been proposed as by Patent Literature 1 or Patent Literature 2. However, when Mg is increased from a conventional level, metals may not melt in preparing a hot dip coating bath, and dross may be generated subject to bath composition and heating condition.

Also with respect to a hot dip metal coating film, the film adhesion after processing may be impaired by formation of an interfacial alloy layer depending on the coating composition, such that a processing method may incur restriction. Especially in the case of a non-equilibrium phase, or a film having deposited an intermetallic compound such tendency is significant, and the proposals of Patent Literature 1 and Patent Literature 2 may similarly incur a restriction in terms of a processing method.

In contrast, with respect to techniques of immersion coating (dipping), thermal spraying, or vapor deposition, since they can be applied to coating of products after processing, they are known as methods of coating hard-to-process alloys. Among them vapor deposition methods, by which steels are not dipped in molten metals, have such advantages that there is little thermal influence on steels, and the allowable range of the melting point of a metal or an alloy usable for coating is broad.

Basic methods of enhancing the corrosion resistance of steels are to add Zn to coated metal layers as in the case of formation of coated metal layers, however films to which solely Zn is added may often result in a film with corrosion resistance not adequate in many applications.

Therefore, a vapor deposition method of a Mg-containing film as described in Patent Literature 3 has been proposed. According to the same, an alloy film including one, or two or more kinds selected from 5% to 30% of Mg, from 0.5 to 5% of Al, Cr, Co, Mn, Ti, and Ni, as well as Zn as the balance is deposited, which is a coating film superior in corrosion resistance. Further, a technology in which a coating monolayer is formed by vapor deposition and thereafter a Zn—Mg coating is formed by a heat treatment has been proposed as described in Patent Literature 4.

Further, Patent Literature 5 proposes "a zinc alloy coated metal material superior in corrosion resistance and processability characterized in that a vapor deposited coated metal layer including Al at from 5 to 70% (weight-%, the same applies hereinafter), as well as one, or two or more kinds selected from Cr, Co, Ti, Ni, and Mg in total from 0.5 to 5% (provided that Ti, and Mg are less than 5%), wherein the balance is substantially Zn, is formed on a surface of metallic equipment".

Patent Literature 1: Japanese Patent Application Laid-Open (JP-A) No. 2008-255464
Patent Literature 2: JP-A No. 2011-190507
Patent Literature 3: JP-A No. H01-021066
Patent Literature 4: JP-A No. H07-268604
Patent Literature 5: JP-A No. H01-21064

SUMMARY OF INVENTION

Technical Problem

In conventional technologies various alloy vapor deposition coatings including the above have been proposed, however any conventional technology has a drawback in that the corrosion resistance (especially corrosion resistance after processing), alkali corrosion resistance, abrasion resistance, and adhesion after processing of a formed coating film are far from adequate.

An embodiment of the disclosure has been developed under such circumstances, with an object to provide a coated steel with a coated metal layer superior in the corrosion resistance (especially, corrosion resistance after processing), alkali corrosion resistance, and abrasion resistance, as well as the coating adhesion after processing.

Solution to Problem

The disclosure has been developed under such circumstances, and include the following embodiments.

[1] A coated steel including a steel, a coated metal layer coated on a surface of the steel, and an interfacial alloy layer formed at the boundary between the steel and the coated metal layer, wherein the composition of the coated metal layer includes in terms of % by mass Zn from 20 to 83%, and Al from 2.5 to 46.5% as well as Mg and impurities as the balance, wherein the Mg content is 10% or more, wherein the structure of the coated metal layer includes a quasicrystalline phase, a $MgZn_2$ phase, and a balance structure, wherein the area fraction of the quasicrystalline phase is from 30 to 60%, and not less than 90 number-% of the quasicrystalline phases are a quasicrystalline phase having a particle diameter in the major axis direction of from 0.05 to 1.0 μm, and wherein the thickness of the coated metal layer is 0.1 μm or more, and the thickness of the interfacial alloy layer is 500 nm or less.

[2] The coated steel according to [1], wherein the area fraction of the balance structure is 40% or less.
[3] The coated steel according to [1] or [2], wherein the thickness of the coated metal layer is from 0.1 to 10 μm.
[4] The coated steel according to any one of [1] to [3], wherein the coated metal layer is a vapor deposited coated metal layer.
[5] The coated steel according to any one of [1] to [4], wherein the interfacial alloy layer is an Al—Fe alloy layer.
[6] The coated steel according to any one of [1] to [5], wherein the coated metal layer includes one, or two or more kinds of selective elements out of C, Ca, Si, Ti, Cr, Fe, Co, Ni, V, Nb, Cu, Sn, Mn, Sr, Sb, Pb, Y, Cd, or La, and the total content of the selective elements is from 0 to 0.5% by mass.

Advantageous Effects of Invention

According to an embodiment of the disclosure, a coated steel superior in corrosion resistance (especially corrosion resistance after processing) and alkali corrosion resistance owing to existence of a quasicrystalline phase in the coated metal layer compared to a conventional Mg-containing coated steel, and also superior in abrasion resistance owing to uniform distribution of fine quasicrystals with high hardness in the coated metal layer may be provided. Further, owing to a thin thickness of an interfacial alloy layer between the coated metal layer and the steel, a coated steel superior in coating adhesion after processing may be provided.

Further, according to an embodiment of the disclosure, the same capabilities can be imparted to an embossed article obtained by processing a steel, to contribute to industrial development by achievement of a longer operating life of a component.

BRIEF DESCRIPTION OF DRAWINGS

FIG. 1 is a sectional side view showing a coated steel according to an embodiment of the disclosure.

FIG. 2 is a graph showing a relationship between temperature and metal vapor pressure.

FIG. 3 is a TEM electron beam diffraction image of a quasicrystalline phase.

DESCRIPTION OF EMBODIMENTS

The inventors have found through their studies that a high Mg Zn—Mg—Al type coated metal layer containing a quasicrystalline phase exhibits high corrosion resistance. At the same time, the inventors also have found that a steel, on which the high Mg Zn—Mg—Al type coated metal layer containing a quasicrystalline phase has been formed, exhibits extremely high hardness and is superior in abrasion resistance.

However, it is a little bit difficult to stabilize a coating bath with the composition, and an operation using a coating bath with a composition in such a range is not easy.

Therefore, the inventors have studied how to apply the high Mg content Zn—Mg—Al type coating onto a steel without using a coating bath with the composition to arrive at the present disclosure.

A coated steel according to an embodiment of the disclosure will be described below.

A numerical range expressed by "x to y" includes the values of x and y in the range as the minimum and maximum values, respectively.

The expression of "%" with respect to the content of a component (an element) means herein "% by mass".

A coated steel 1 coated with a Mg-containing Zn alloy coated metal layer according to the embodiment is composed essentially of a steel 2 for a steel sheet, a steel pipe, a civil engineering building material (a guard rail, a shielding wall, a corrugated pipe, etc.), a household electrical appliance component (a housing of an outdoor unit of an air conditioner, etc.), automotive parts (a chassis component, etc.), etc., and a coated metal layer 3 (vapor deposited coated metal layer) formed by vapor deposition on a surface of the steel 2 as shown in a cross-sectional structure in FIG. 1 (a cross-sectional structure cut in the thickness direction of a coated metal layer). At an interface between the steel 2 and the coated metal layer 3, a thin interfacial alloy layer (a Fe—Al alloy layer) 4 is formed.

There is no particular restriction on the material of a steel 2 to function as a substrate for a coating. As a steel 2, for example, a common steel, a Ni pre-coated steel, an Al-killed steel, and a part of high-alloy steels may be applicable. Also there is no particular restriction on the shape of a steel 2, and it may have been already molded.

A steel 2 is not limited to be planar as shown in FIG. 1, and a shape steel bent into an L shape or the like may be also used. Further, a coated metal layer 3 may be formed on a steel 2 processed by various plastic forming techniques, such as pressing, roll forming, and bending, into an intended shape.

The structure, composition, etc. of a coated metal layer 3 and an interfacial alloy layer 4 will be described below.

In the boundary region between a coated metal layer 3 and a steel 2, an interfacial alloy layer 4 with a thickness of, for example, 500 nm or less is formed. A coated metal layer 3 is constituted with a Zn—Mg—Al alloy layer with a thickness of from 0.1 to 10 μm. An interfacial alloy layer 4 is constituted with an Al—Fe alloy layer. An interfacial alloy layer 4 may be formed as a very thin layer, which is hardly recognizable depending on a production condition for a coated metal layer 3.

Since the thickness of an interfacial alloy layer 4 is very much affected by a vapor deposition condition for a coated metal layer 3, there is no particular restriction on the lower limit of the thickness of an interfacial alloy layer 4, however it is preferably, 300 nm or more from the viewpoint of the adhesion of a coated metal layer 3. When the thickness of an interfacial alloy layer 4 exceeds 500 nm, the adhesion of a coated metal layer 3 decreases such that the coated metal layer 3 may be apt to be peeled from the surface of a steel 2, when the steel 2 is subjected to a plastic processing.

When the thickness of a coated metal layer 3 is less than 0.1 μm, it is difficult to acquire adequate corrosion resistance. Meanwhile, although it is possible to produce a coated metal layer 3 with a thickness of 10 μm or more, when it is produced by a continuous process, the productivity may be inferior. Therefore, the thickness of a coated metal layer 3 should be 0.1 μm or more, and is preferably from 0.1 to 10 μm, and more preferably from 0.5 to 5 μm. Especially, when the thickness of a coated metal layer 3 is from 0.5 to 5 μm, both the corrosion resistance after coating and the adhesion of a coating are secured.

In this regard, the thicknesses of a coated metal layer 3 and an interfacial alloy layer 4 are measured as follows. Cross-section observation of a coated metal layer 3 and an interfacial alloy layer 4 (observation of a region equivalent to a length of 2.5 mm parallel to a coated metal layer 3 and an interfacial alloy layer 4 in a cross-section cut in the thickness direction of a coated metal layer 3 and an interfacial alloy layer 4) is conducted with a scanning electron microscope (SEM). The mean value of thicknesses at optional five positions for each coated metal layer 3 or each interfacial alloy layer 4 observed in at least three visual fields (magnification 10,000×) in the region (each at least 15 positions) is calculated. The mean value is defined as the thickness of a coated metal layer 3 or an interfacial alloy layer 4.

Preparation of a sample for cross-section observation may be performed by a publicly known resin embedding method, or cross section polishing method.

In a coated metal layer 3 a quasicrystalline phase is precipitated. Namely, a coated metal layer 3 contains plural quasicrystalline phases. It is preferable that not less than 90 number-% of the quasicrystalline phases precipitated in a coated metal layer 3 are a quasicrystalline phase having a particle diameter in the major axis direction of from 0.05 to 1.0 μm. Further, an extremely thin oxide film may be formed on a surface of a coated metal layer 3

An interfacial alloy layer 4 is formed on a surface of a steel 2, and is a layer with a Fe concentration in a range of from 10% to 90%. Namely, an interfacial alloy layer 4 contains at least one of $Fe_3Al$, $FeAl_3$, $Fe_2Al_5$, $FeAl_3$, and an intermetallic compound in which part of Fe and Al is substituted with Zn.

The average composition of an interfacial alloy layer 4 is, for example, Fe from 30 to 50% by mass, Al from 50 to 70% by mass, Zn from 2 to 10% by mass, and impurities as the balance.

Since a coated metal layer 3 contains Al, and Zn at high contents, Al in a coated metal layer 3 reacts with Fe in a steel 2 to form an $Al_3Fe$ phase on a surface of the steel 2. Further, Zn, which is a component of a coated metal layer 3 is inevitably captured to form an interfacial alloy layer 4, which incorporates part of Zn and has a property slightly different from an $Al_3Fe$ phase.

Since an interfacial alloy layer 4 is composed of an Al—Fe alloy constituted mainly with an $Al_3Fe$ phase, for example, the average Fe concentration of an alloy layer becomes naturally between 30 and 50%. The average Al concentration becomes between 50 and 70%.

In a case in which a coated metal layer 3 is formed by a vapor deposition method, with respect to the component composition of a coated metal layer 3 of a Zn—Mg—Al alloy, the component composition of vapor deposition source metals, which is determined almost by a film producing speed, is maintained also in the coated metal layer 3. Decrease in the Al component and Zn component in a Zn—Mg—Al alloy layer by reason of formation of an interfacial alloy layer 4 is usually minimal. This is because, the formed interfacial alloy layer 4 is extremely thin.

The inventors have examined closely concerning the composition range in which a quasicrystalline phase is obtainable by a vapor deposition coating method and found that a quasicrystalline phase may acquire a necessary area fraction in a Zn—Mg alloy layer in the following composition range.

Namely, the composition of a coated metal layer 3 in terms of % by mass is Zn at a content of from 20 to 83%, Al at a content of from 2.5 to 46.5%, and Mg and impurities as the balance, wherein the Mg content is 10% or more.

With respect to the composition of a coated metal layer 3, a desirable range and the reason therefor will be described.

"Zn (Zinc): From 20 to 83%"

For obtaining a quasicrystalline phase as a metallic structure of a coated metal layer 3, it is essential to contain Zn in the above range. For this reason, the Zn content in a coated metal layer should be from 20 to 83%. When the Zn content is less than 20%, it becomes difficult to form a quasicrystalline phase in a coated metal layer 3. Similarly, when the Zn content exceeds 83%, it becomes difficult to form a quasicrystalline phase in a coated metal layer 3.

For improving further the corrosion resistance by forming appropriately a quasicrystal, the Zn content is more preferably 60% or more (namely between 60 and 83%). When it is 60% or more, the composition range becomes favorable for a quasicrystalline phase to grow as a primary crystal, so that growth of a Mg phase as a primary crystal is suppressed. In other words, the quantity of a quasicrystalline phase (area fraction) in a coated metal layer 3 may be increased and a Mg phase which deteriorates corrosion resistance may be minimized.

"Al (Aluminum): From 2.5 to 46.5%"

Al is an element to improve the corrosion resistance of a planar part of a coated metal layer 3. Further, Al is an element to promote formation of a quasicrystalline phase. For developing such effects, the Al content in a coated metal layer 3 should be 2.5% or more. For regulating the average equivalent circle diameter of a quasicrystalline phase in a preferable range, the Al content is preferably 3% or more, and more preferably 5% or more.

On the other hand, in a case in which a large amount of Al is contained, the alkali corrosion resistance decreases, and further formation of a quasicrystalline phase is suppressed, such that the corrosion resistance decreases. Therefore, the Al content should be 46.5% or less, and is preferably 20% or less.

Therefore, the Al content in a coated metal layer 3 should be from 2.5 to 46.5%, is preferably from 3 to 20%, and more preferably from 5 to 20%.

"Mg (Magnesium): Balance"

Mg, similar to Zn and Al, is a principal element to constitute a coated metal layer 3, and is further an element to improve the sacrificial corrosion protection property. Further, Mg is an important element to promote formation of a quasicrystalline phase. Therefore, the Mg content as the balance should be 10% or more, is preferably in a range of from 10 to 43%, and more preferably in a range of from 15 to 35%. When the Mg content is 10% or more, and insofar as the sole purpose is to form a quasicrystalline phase, a heat treatment is not necessary for forming stably a quasicrystalline phase. Although inclusion of Mg is indispensable, it is preferable for improvement of the corrosion resistance to inhibit precipitation of the included Mg as a Mg phase in a coated metal layer 3.

Further, a coated metal layer 3 may contain one, or two or more kinds of selective elements out of C, Ca, Si, Ti, Cr, Fe, Co, Ni, V, Nb, Cu, Sn, Mn, Sr, Sb, Pb, Y, Cd, or La. However, the total content of the selective elements should be from 0 to 0.5% by mass.

The elements may be contained in a coated metal layer 3, and the above range for the total content is a composition range, in which they may be added without impeding formation of a quasicrystalline phase, or without deteriorating the performance of a coated metal layer. When the total content exceeds the range, formation of a quasicrystalline phase may be suppressed.

Meanwhile, the measuring methods of the composition of a coated metal layer 3, and the thickness of a coated metal layer 3 or an interfacial alloy layer 4 are as follows.

An interfacial alloy layer 4 (Fe—Al layer) is passivated by fuming nitric acid and only a coated metal layer 3 as an upper layer is peeled, and a solution thereof is analyzed by inductively coupled plasma atomic emission spectrometry (ICP-AES), or inductively coupled plasma mass spectrometry (ICP-MS) to measure the composition of the coated metal layer 3.

Next, the structure of a coated metal layer will be described.

The structure of a coated metal layer 3 is constituted with a quasicrystalline phase, a $MgZn_2$ phase, and the balance structure, wherein the area fraction of the quasicrystalline phase is from 30 to 60%, and among a plurality of quasicrystalline phases, not less than 90 number-% of the quasicrystalline phases are a quasicrystalline phase having a particle diameter in the major axis direction of from 0.05 to 1.0 μm (hereinafter the particle diameters of quasicrystalline phases with a particle diameter of from 0.05 to 1.0 μm is also referred to as "particle diameter of not less than 90% of quasicrystalline phases").

When a quasicrystalline phase, which is hard, occupies 30% or more in terms of an area fraction in the structure of a coated metal layer 3, the abrasion resistance is improved.

Further, when a quasicrystalline phase is present, it has a positive effect also on corrosion resistance. However, since a quasicrystalline phase is hard, when the area fraction of a quasicrystalline phase exceeds 60%, cracking occurs during processing to decrease the coating adhesion after processing. Therefore, the area fraction of a quasicrystalline phase is preferably from 30 to 60%, and more preferably from 35 to 50%.

A $MgZn_2$ phase enhances abrasion resistance, corrosion resistance, and alkali corrosion resistance similarly to a quasicrystal. Although a $MgZn_2$ phase improves the respective performances, the effect of a quasicrystalline phase is higher. Meanwhile, with respect to coating adhesion after processing, the degree of decrease is lower than a quasicrystalline phase. Therefore, it is recommendable to enhance the corrosion resistance, alkali corrosion resistance, and abrasion resistance, while securing the adhesion of a coated metal layer 3 after processing. From this viewpoint, the total area fraction of a quasicrystalline phase and a $MgZn_2$ phase preferably satisfies 60%≤quasicrystalline phase+$MgZn_2$ phase≤90%, and more preferably 70%≤quasicrystalline phase+$MgZn_2$ phase≤85%.

Meanwhile, the area fraction of the balance structure is preferably 40% or less, and more preferably 30% or less. When the area fraction of the balance structure is reduced and the total area fraction of a quasicrystalline phase and a $MgZn_2$ phase is increased, the corrosion resistance, alkali corrosion resistance, and abrasion resistance may be enhanced, while securing the adhesion of a coated metal layer 3 after processing. The area fraction of the balance structure may be 0%, however is preferably 10% or more from the viewpoint of coating adhesion after processing.

In this regard, a quasicrystalline phase in a coated metal layer 3 is defined as a quasicrystalline phase in which the Mg content, the Zn content, and the Al content phase in terms of atom-% satisfy 0.5≤Mg/(Zn+Al)≤0.83. In other words, it may be defined as a quasicrystalline phase in which the ratio of Mg atom to a total of Zn atom and Al atom, namely Mg/(Zn+Al) is from 3/6 to 5/6. It is believed that the theoretical ratio of Mg/(Zn+Al) is 4/6.

Chemical components of a quasicrystalline phase are preferably calculated based on a quantitative analysis by transmission electron microscope-energy dispersive X-ray spectroscopy (TEM-EDX), or a quantitative analysis by electron probe micro-analyzer (EPMA) mapping. It is not easy to define a quasicrystal by an accurate chemical formula as in the case of an intermetallic compound. This is because a repetitive lattice unit such as a unit lattice of a catalyst cannot be defined for a quasicrystal, and further the atom position of Zn, or Mg may be hardly specified.

Although a coated metal layer 3 contains a $MgZn_2$ phase and the balance structure besides a quasicrystalline, the balance structure is a structure other than a quasicrystalline phase and a $MgZn_2$ phase, and includes a $Mg_{51}Zn_{20}$ phase, a $Mg_{32}(Zn, Al)_{49}$ phase, a MgZn phase, a $Mg_2Zn_3$ phase, a Zn phase, and an Al phase.

A quasicrystalline phase is a crystal structure discovered first in 1982 by Dr. Daniel Shechtman, and has an icosahedral atomic arrangement. This crystal structure is an aperiodic crystal structure having unique rotational symmetry, such as 5-fold symmetry, not obtainable with an ordinary metal, or alloy, and is known as a crystal structure equivalent to an aperiodic structure represented by 3-dimensional Penrose pattern. For identification of this metal substance, it is to be validated that a radial regular-decagonal electron beam diffraction image derived from an icosahedral structure is obtained from the phase, ordinarily by electron beam observation based on TEM observation. For example, the electron beam diffraction image shown in FIG. 3 below is obtainable only from a quasicrystal but not from any other crystal structures.

Meanwhile, a quasicrystalline phase obtained from a composition of a coated metal layer 3 shows a diffraction peak by X-ray diffraction identifiable for simplification sake as a $Mg_{32}(Zn, Al)_{49}$ phase with JCPDS cards: PDF #00-019-0029, or #00-039-0951.

A quasicrystalline phase is a substance having excellent corrosion resistance, and when it is present in a coated metal layer 3 (Zn—Mg—Al layer) the corrosion resistance is improved. Especially, when it is contained in a vapor deposited coated metal layer at a content in terms of area fraction of 5% or more, white rust tends to be inhibited in an early stage of corrosion. When it is contained at a content in terms of area fraction of 30% or more, the effect becomes stronger. In other words, a quasicrystalline phase formed on a surface of a coated metal layer 3 (Zn—Mg—Al layer) exhibits a high barrier effect with respect to corrosion factors.

Next, a measuring method of an area fraction of a quasicrystalline phase, a $MgZn_2$ phase, or the balance structure in a coated metal layer 3 will be described.

SEM-backscattered electron images of at least three visual fields (at least three visual fields of a region equivalent to a length of 500 μm parallel to a coated metal layer 3 at a magnification of 5,000×) of an optional cross-section of a coated metal layer 3 (a cross-section of a coated metal layer cut in the thickness direction) are photographed. Referring to separately obtained experimental results of TEM observation, a quasicrystalline phase, a $MgZn_2$ phase, and the balance structure in a SEM-backscattered electron image are specified. Compassing a component mapping image in a predetermined visual field, spots having the same component composition as a quasicrystalline phase, a $MgZn_2$ phase, or the balance structure in a coated metal layer 3 are specified, followed by an image processing to specify a quasicrystalline phase, a $MgZn_2$ phase, and the balance structure in a coated metal layer 3. Images having selected the respective ranges of a quasicrystalline phase, a $MgZn_2$ phase, and the balance structure are prepared by an image analyzer, and the percentages of a quasicrystalline phase, a $MgZn_2$ phase, and the balance structure in a coated metal layer 3 are measured. The mean value of three visual fields treated as above is used as an area fraction for each quasicrystalline phase, $MgZn_2$ phase, and balance structure in a coated metal layer 3.

For identification of each phase in a coated metal layer 3, a cross-section of a coated metal layer 3 (a cross-section cut in the thickness direction of a coated metal layer) is processed by a focused ion beam (FIB), and then an electron diffraction image by transmission electron microscopy (TEM) is analyzed.

When a quasicrystalline phase is corroded by an accelerated corrosion test or otherwise, a corrosion product with a high barrier effect is formed to protect a steel matrix from corrosion for a long term. The content ratio of a Zn—Mg—Al contained in a quasicrystalline phase is related with a corrosion product with a high barrier effect. With respect to the component composition in a coated metal layer 3 (a Zn—Mg—Al alloy layer), when the equation Zn>Mg+Al (therein an element symbol stands for the content (% by mass) of the element) holds, the barrier effect of the corrosion product is high. With respect to corrosion resistance, a higher area fraction of a quasicrystalline phase is generally preferable. When the area fraction of a quasicrystalline phase is 80% or more, the effect is especially great. The effect develops significantly in a combined cyclic corrosion test including a cyclic salt spray test (SST).

Although a $MgZn_2$ phase and a $Mg_2Zn_3$ phase have a corrosion resistance improvement effect owing to their presence weaker than a quasicrystalline phase, they still have some corrosion resistance, and are superior in alkali corrosion resistance owing to their high Mg content. Even when an intermetallic compound constituted solely with them is present in a coated metal layer 3, alkali corrosion resistance may be obtained, moreover, if a quasicrystalline phase coexists, an oxide film on a top layer of a coated metal layer 3 is stabilized in a high alkali environment (pH 13 to 14) of a quasicrystalline phase to exhibit especially high corrosion resistance. Therefore, it is preferable to contain a quasicrystalline phase in a coated metal layer 3 at an area fraction of 30% or more.

Meanwhile, when the particle diameter of not less than 90 number-% of quasicrystalline phases in the structure of a coated metal layer 3, is larger than 1.0 μm, a crack is propagated from a grain boundary by processing to decrease the adhesion of a coated metal layer 3 after processing. In other words, when the particle diameter of not less than 90% of plural quasicrystalline phases is 1.0 μm or less, the adhesion of a coated metal layer 3 after processing is improved and the abrasion resistance is also improved owing to fine distribution of powder particles. When the particle diameter of not less than 90 number-% of quasicrystalline phases is less than 0.05 μm, the abrasion resistance does not develop adequately. Therefore, the particle diameter of not less than 90 number-% of quasicrystalline phases is preferably from 0.1 to 0.5 μm, and more preferably from 0.1 to 0.3 μm.

The percentage of quasicrystalline phases having a particle diameter from 0.05 to 1.0 μm is preferably 90 number-% or more, and more preferably 95 number-% or more.

The particle diameter of a quasicrystalline phase (particle diameter in the major axis direction), and the percentage of quasicrystalline phases having a particle diameter from 0.05 to 1.0 μm are measured by the following methods.

At least three visual fields (at least three visual fields of a region equivalent to a length of 500 μm parallel to a coated metal layer 3 at a magnification of 5,000×) of an optional cross-section of a coated metal layer 3 (a cross-section of a coated metal layer cut in the thickness direction) are photographed by the same technique used for the above measuring method of an area fraction of a quasicrystalline phase, and the particle number of quasicrystalline phases in a coated metal layer 3 is counted. The length of a quasicrystalline phase in the major axis direction (namely, the line length of the longest diameters of a quasicrystalline phase) is measured as a particle diameter. Then the ratio of quasicrystalline phases having a particle diameter of from 0.05 to 1.0 μm to the total number of particles counted is calculated Next, a method of producing a coated steel according to the embodiment will be described in detail.

A steel 2 is desirably subjected to surface cleaning (hydrochloric acid pickling, washing with water, and drying) before vapor deposition of a coated metal layer 3. A solid oxide film formed on a top layer of a steel 2 is removed, for example, by immersion in 10% hydrochloric acid for 10 min or longer. After pickling, the steel is washed with water, and dried to remove surface moisture using a drier or a drying oven.

For forming a coated metal layer 3 on a surface of a steel 2, for example, a vapor deposition method using a vacuum chamber is used. Although in the following description a case in which a coated metal layer 3 is formed in a closed system is described, a system allowing continuous feeding may be able to obtain a similar result.

Vacuum deposition is carried out ordinarily under a pressure of from $10^{-2}$ to $10^{-5}$ Pa, and in this case the mean free path is from several tens of centimeters to several tens of meters. Therefore, a material vaporized from a deposition metal source reaches a surface of a steel 2 substantially without collision. Since the energy of an evaporated particle is extremely low, it gives substantially no damage to the surface of a steel 2. Nevertheless, a coated metal layer 3 is apt to become porous, and there is tendency that the density becomes low, and the strength becomes insufficient. This is because the energy of an evaporated particle is so low that the particle is not able to move from an arrival point on a steel surface.

Therefore, during film formation (coating) by vapor deposition the impingement rate of a deposition particle onto a steel 2 should be adequately higher than the impingement rate of a residual gas in the chamber onto a substrate, otherwise the residual gas may be incorporated into a coated metal layer 3. The component with the highest content in a residual gas is $H_2O$. When $H_2O$ is incorporated in a coated metal layer 3, voids are formed in a coated metal layer 3, so that a porous and brittle coated metal layer is formed.

As a remedy for the situation, it is effective to heat a steel 2 in performing vapor deposition coating. In a case in which the temperature of a steel 2 is high, the sticking probability of a residual gas to a steel 2 is decreased and the amount of the same incorporated in a coated metal layer 3 is reduced. Further, a deposition metal adsorbed on a steel 2 is apt to move owing to thermal energy, and the same stuck to an unstable site may move to a stable site, so that the density of a coated metal layer 3 may be increased.

For securing presence of a quasicrystalline phase and a ZnMg phase in a coated metal layer 3 and favorable adhesion after processing of a coated metal layer 3, it is desirable to heat a steel during vapor deposition. The temperature of a steel 2 is desirably from 50 to 400° C. At a temperature lower than 50° C., a metal atom deposited on a surface of a steel 2 does not form a crystal phase adequately but forms only a coated metal layer 3 with many voids, so that adequate corrosion resistance may not be obtained. When the temperature of a steel 2 is set at 400° C. or higher, and vapor deposition coating is carried out over a long time period, an interfacial alloy layer 4 grows thick, which may cause decrease in the adhesion after processing of a coated metal layer 3. Therefore, the surface of a steel 2 should be desirably heated between 150 and 350° C., and more desirably between 200 and 300° C. to perform vapor deposition (film deposition).

When a coated metal layer 3 is formed by vapor deposition, the vapor deposition rate is determined by the following.

[1] It is determined by the temperature of a deposition metal source and the vapor pressure of the metal source at such moment.

[2] It is determined by the surface area, or volume of a deposition metal source.

[3] It is determined by the distance from a deposition metal source to a steel 2, or an inner volume of a chamber.

Meanwhile, a heating method applicable to a method of vapor deposition of a coated metal layer 3 may select any of the following examples.

(1) Resistance heating; (2) Electron beam heating; (3) High frequency induction heating; and (4) Laser heating.

It is preferable to use an appropriate vapor deposition method according to the characteristics of a metal to be evaporated.

By resistance heating, Joules heat is generated by applying a voltage between both the ends of a high melting point metal or various heating element materials. It is possible to melt a deposition metal source by placing the same on a sample stage undergoing resistance heating.

By wire heating, a thermal electron generated by resistance heating of a filament of tungsten, etc. is accelerated by a high voltage and impinged on a metal evaporation source. Since kinetic energy of an electron is transformed into heat upon collision, a metal evaporation source may be melted.

High frequency induction heating is a method of heating a material for evaporation by an eddy-current loss and a hysteresis loss caused by high-frequency induction. A high-frequency electric power is applied to a coil placed surrounding a crucible containing a material for heating, so as to melt a metal evaporation source.

By laser heating, high power laser is used for heating and evaporation. Laser light is generally introduced through a window into a vacuum chamber and condensed by a lens, a concave mirror plane, or the like to heat and melt a deposition metal source.

[Formation of Coated Metal Layer]

Upon completion of evacuation of a chamber to a vacuum, a deposition metal is heated close to the melting point with a closed cover above the deposition metal source. In this case, if a deposition metal is overheated, a surface of a molten metal wobbles and a uniform vapor deposition coating is not achievable. When the heating temperature is too low, the metal does not evaporate sufficiently. Since the vapor deposition amount is roughly determined by the vapor pressure at a heating temperature, it is to be determined by temperature, and pressure, as well as the then degree of vacuum in a chamber.

FIG. 2 is a graph showing a relationship between temperature (K) and vapor pressure (Pa) of various metals. A heating temperature for each vapor deposition source may be determined, learning a relationship between temperature and vapor pressure from the relationship shown in FIG. 2, in a case, in which each of Al, Mg, and Zn as a deposition metal source is used individually.

When heating of a deposition metal is completed, the cover above a deposition metal source is removed and deposition is started. When a deposition chamber is small and the distance from the metal evaporation source to a steel 2 is short, it is desirable to rotate a steel 2 or the deposition metal source for the sake of uniform deposition of respective elements.

An evaporated metal element flies to a surface of a steel 2 to deposit as a film, and the crystal grain diameter, or the thickness of an interfacial alloy layer 4 with a steel 2 changes according to the temperature of a steel 2.

A metal evaporated from an evaporation source deposits on a surface of a steel 2 almost in a quenched state. Since the mobility of an adsorbed metal changes according to the temperature of a steel 2, the respective crystal grain diameters change accordingly.

With respect to a metal for coating a steel 2, the retention temperature of each deposition metal and the pressure in a deposition chamber are adjusted for realizing the composition a coated metal layer 3, which contains Zn at from 20 to 83%, and Al at from 2.5 to 46.5%, and the balance includes Mg and impurities, wherein the Mg content is 10% or more.

After coating, the degree of vacuum in a chamber is returned close to the atmospheric pressure using an inert gas such as $N_2$, and a steel 2 is taken out.

A coated steel 1 coated with a coated metal layer 3 having the aforedescribed composition and structure is characterized in that it is superior in corrosion resistance against salt water, and alkali corrosion resistance, superior in adhesion after processing, and also superior in abrasion resistance.

In producing a coated steel according to the present disclosure, a posttreatment may be performed after formation of a coated metal layer.

Examples of a posttreatment may include various treatments for treating a surface of a coated steel sheet, and include specifically a treatment for providing an upper coating, a chromate treatment, a non-chromate treatment, a phosphate treatment, a lubricity improvement treatment, and a weldability improvement treatment. Further, a posttreatment after coating may include a treatment by which a resin-based paint (such as a polyester resin-based, an acrylic resin-based, a fluorocarbon resin-based, a vinyl chloride resin-based, a urethane resin-based, and an epoxy resin-based paint) is painted by a method, such as a roll painting, a spray painting, a curtain flow painting, a dip painting, and a film lamination method (for example, a film lamination method of laminating a resin film such as an acrylic resin film), to form a paint film.

Examples

Next the present disclosure will be described based on an Example.

Firstly, deposition metals (Al, Mg, and Zn) placed in a chamber were heated individually by an electron beam at vapor deposition of a coated metal layer. Although it is possible to heat an alloy of the elements to evaporate and deposit, since the melting points and vapor pressures of the respective metals are different each other, when vapor deposition with an alloy is tried, control of the composition distribution in the depth direction of a coated metal layer becomes difficult, therefore individual vapor deposition sources were used for the respective elements. Vapor deposition conditions were as follows.

Device volume (volume in chamber): 0.6 $m^3$

Distance from deposition metal source to steel sheet (substrate): 0.6 m

Degree of vacuum during vapor deposition: 5.0E-3 to 2.0E-5 Pa,

Volume of crucible for deposition metal source: 40 mL, inner diameter: 30ϕ,

Vapor deposition method: electron beam,

Electron beam irradiation conditions: voltage 10 V (fixed), current 0.7 to 1.5 A, Steel sheet temperature: 50 to 600° C., Steel sheet rotation speed: 15 rpm.

When vapor deposition is performed by heating deposition metals (Al, Mg, and Zn) by electron beam irradiation, the current for electron beam irradiation with respect to each metal is regulated in the above range (range from 0.7 to 1.5 A). By the current regulation, the metal temperature changes such that the composition of a coated metal layer to be formed on a steel sheet may be changed. The temperature of a deposition metal source is measured with a thermocouple.

For example, in the case of No. 14 specimen, the average temperature of a steel sheet was raised to 423.15K (150° C.), and maintaining the condition, the average temperature of each deposition metal source was set for Mg at 640K, for Al at 1280K, and for Zn at 585K, the average degree of vacuum in the chamber was set at $7 \times 10^{-4}$ Pa, and the vapor deposition time was set at 6 min.

Then referring to the composition of the coated metal layer of No. 14 specimen and the relationship between temperature and metal vapor pressure shown in FIG. 2, the temperature of each metal was changed so as to attain an intended composition of a coated metal layer. Also by regulating the vapor deposition time a desired thickness of a coated metal layer was attained.

The structure of a coated metal layer was regulated by the composition of a coated metal layer and the average temperature of a steel sheet.

A steel sheet specimen (size: 200 mm long, 200 mm wide, and 0.8 mm thick) covered with one of coated metal layers having respectively a particle diameter of quasicrystalline phase, a thickness of an interfacial alloy layer, and a composition set forth in Table 1 was prepared by regulating the aforedescribed vapor deposition conditions, and each of the obtained specimens was subjected to an evaluation of corrosion resistance, an evaluation of corrosion resistance after processing, an evaluation of alkali corrosion resistance, an evaluation of coating adhesion after processing (bending test), and an evaluation of abrasion resistance. The results are also shown in the following Table 1 and Table 2. For the particle diameter of a quasicrystalline phase, a particle diameter in the major axis direction was measured.

<Area Fraction of Each Phase>

The area fractions of a quasicrystalline phase, a $MgZn_2$ phase, and the balance structure were measured by the aforedescribed method.

<Particle Diameter in Major Axis Direction of Quasicrystalline Phase>

The particle diameter in the major axis direction was measured by the aforedescribed method.

With respect to Table 1, in a case in which "Particle number of quasicrystalline phases having a particle diameter (length in the major axis direction) of from 0.05 to 1 μm"/"Particle number of total quasicrystalline phases"≥0.9, the average particle diameter of quasicrystalline phases (average length in the major axis direction) was entered in Table 1; and in a case in which "Particle number of quasicrystalline phases having a particle diameter (length in the major axis direction) of from 0.05 to 1 μm"/"Particle number of total quasicrystalline phases"<0.9, "NG" was entered in Table 1 and the average particle diameter of quasicrystalline phases (average length in the major axis direction) is entered in parentheses.

In this regard, some of the specimens of "NG", in which the entire coated metal layer was occupied by quasicrystalline phases, such that the particle diameter of a quasicrystalline phase was not measurable. In such a case "–" was noted.

<Evaluation of Abrasion Resistance>

The abrasion resistance of a vapor deposited coated metal layer was measured using a linear friction tester produced by HEIDON. A steel ball (20R, material SKD11) was used as a contacting member, and a load of 500 g, a sliding distance of 40 mm, and a speed of 1200 mm/min were used. After 10 round trips, a surface of a specimen (coated steel sheet) was visually examined and evaluated. In a case in which a clear scratch or chipping was visible on a surface of a coated metal layer after the test, it was rated as "D". In a case in which the color after the test at a not-tested area of the coating surface was significantly changed from that at a tested area, it was rated as "C". In a case in which the color after the test at a not-tested area of the coating surface was slightly changed from that at a tested area, it was rated as "B". In a case in which the appearance was almost the same as before the test, it was rated as "A". The results are also shown in the following Table 1 and Table 2.

In this regard, with respect to the rating "C", three sub-ratings of "C−", "C" and "C+" were given according to the severity of color change, wherein the order of "C−", "C" and "C+" corresponds to the mildness of color change.

<Evaluation of Corrosion Resistance>

The corrosion resistance of a vapor deposited coated metal layer was evaluated by a combined cyclic corrosion test (CCT) according to JASO M-609-91. After five cycles, a specimen (coated steel sheet), on which coated metal layer red rust appeared at an area ratio of 60% or more, was rated as "D", and a specimen, in which red rust appeared at an area ratio from 50% to less than 60%, was rated as "C−". A specimen, in which red rust appeared at an area ratio of from 40% to less than 50%, was rated as "C". A specimen, in which red rust appeared at an area ratio of from 30% to less than 40%, was rated as "C+". A specimen, in which red rust appeared at an area ratio of more than 10% but less than 30%, was rated as "B", and a specimen, in which red rust appeared at an area ratio of not more than 10% was rated as "A". The results are also shown in Table 1 and Table 2.

<Evaluation of Corrosion Resistance after Processing>

Corrosion resistance after processing of a vapor deposited coated metal layer was evaluated identically with the above evaluation of corrosion resistance, except that prior to execution of the evaluation of corrosion resistance a specimen (coated steel sheet) was subjected to 2R-60° V bending, and then the end surfaces, and the back side were covered with a tape.

Then, after 10 cycles, a specimen (coated steel sheet), on which coated metal layer red rust appeared at an area ratio of 80% or more, was rated as "D". A specimen, in which red rust appeared at an area ratio of from 70% to less than 80%, was rated as "C−". A specimen, in which red rust appeared at an area ratio of from 60% to less than 70%, was rated as "C". A specimen, in which red rust appeared at an area ratio of from 50% to less than 60%, was rated as "C+". A specimen, in which red rust appeared at an area ratio of more than 30% but less than 50%, was rated as "B", and a specimen, in which red rust appeared at an area ratio of not more than 30% was rated as "A". The results are also shown in Table 1 and Table 2.

<Evaluation of Alkali Corrosion Resistance>

Alkali corrosion resistance of a vapor deposited coated metal layer was evaluated in terms of corrosion weight loss after immersion of a coated steel sheet in an aqueous caustic soda solution controlled by a pH buffering apparatus for a predetermined time period. A specimen (coated steel sheet), which end surfaces were sealed in water stirred with a 3 cm-long stirring element at a rotation rate of 100 rpm, was immersed in a 0.5% NaCl aqueous solution (2 L) (pH 13) for 6 hours, and the weight loss of the specimen (coated steel sheet) was measured.

A sample, for which the corrosion weight loss was not less than 10 $g/m^2$, or in which the coated metal layer was dissolved to expose a steel sheet, was rated as "D". A sample, for which the corrosion weight loss was from 8.5 $g/m^2$ to less than 10 $g/m^2$, was rated as "C−". A sample, for which the corrosion weight loss was from 7.5 $g/m^2$ to less than 8.5 $g/m^2$, was rated as "C". A sample, for which the corrosion weight loss was from 6 $g/m^2$ to less than 7.5 $g/m^2$, was rated as "C+". A sample, for which the corrosion weight loss was less than 6 $g/m^2$, was rated as "B". A sample, for which the corrosion weight loss was less than 3 g/m², was rated as "A". The respective ratings are also shown in Table 1 and Table 2.

<Evaluation of Coating Adhesion after Processing (Bending Test)>

For evaluating processability of a specimen (coated steel sheet), (j) a bending test method among the adhesion test methods of metallic coatings according to JIS H 8504 was performed. Thereafter, (l) a tape test method among (g) peeling test methods was performed using a pressure sensitive adhesive tape according to JIS Z 1522 to evaluate the coating adhesion of a specimen (coated steel sheet).

A sample, in which a coated metal layer was peeled at a stage where the specimen (coated steel sheet) was bent, the rating was decided as "D". When a tape was stuck to a bend of a sample and then peeled, in a case in which part of the coating adhered the tape, the rating was decided as "C". In a case in which the coating was not peeled by a tape, but when a sample was unbent, part of the coating was peeled, the rating was decided as "B". In a case in which the coating was not peeled by a tape, and even when a sample was unbent, the coating was not peeled, the rating was decided as "A". The respective ratings are also shown in Table 1 and Table 2.

In this regard, with respect to the rating "C", three sub-ratings of "C−", "C" and "C+" were given according to the degree of sticking, wherein the order of "C−", "C" and "C+" corresponds to the mildness of sticking.

TABLE 1

| No | Substrate temperature (°C.) | Particle diameter of quasi-crystalline phase (μm) | Thickness of interfacial alloy layer (nm) | Zn | Al | Mg | MgZn$_2$ phase | Quasi-crystalline phase | Balance |
|---|---|---|---|---|---|---|---|---|---|
|  |  |  |  | (% by mass) |  |  | (% by volume) |  |  |
| 1 | 50 | 0.08 | not more than 100 nm | 83 | 2.5 | 14.5 | 38 | 2 | 60 |
| 2 | 50 | 0.6 | not more than 100 nm | 68 | 13 | 19 | 0 | 55 | 45 |
| 3 | 50 | 0.56 | not more than 100 nm | 22 | 32 | 46 | 0 | 48 | 52 |
| 4 | 50 | 0.06 | not more than 100 nm | 59 | 5 | 36 | 2 | 8 | 90 |
| 5 | 50 | 0.06 | not more than 100 nm | 11 | 46.5 | 42.5 | 0 | 2 | 98 |
| 6 | 50 | 0.08 | not more than 100 nm | 38 | 40 | 22 | 0 | 2 | 98 |
| 7 | 50 | 0.09 | not more than 100 nm | 72 | 6 | 22 | 12 | 24 | 64 |
| 8 | 150 | 0.16 | not more than 100 nm | 83 | 2.5 | 14.5 | 76 | 4 | 20 |
| 9 | 150 | 1 | not more than 100 nm | 68 | 13 | 19 | 0 | 80 | 20 |
| 10 | 150 | 0.96 | not more than 100 nm | 22 | 32 | 46 | 0 | 77.6 | 22.4 |
| 11 | 150 | 0.1 | not more than 100 nm | 59 | 5 | 36 | 4 | 16 | 80 |
| 12 | 150 | 0.11 | not more than 100 nm | 11 | 46.5 | 42.5 | 0 | 4 | 96 |
| 13 | 150 | 0.18 | not more than 100 nm | 38 | 40 | 22 | 0 | 4 | 96 |
| 14 | 150 | 0.45 | not more than 100 nm | 72 | 6 | 22 | 24 | 48 | 28 |
| 15 | 350 | 0.2 | 260 | 83 | 2.5 | 14.5 | 95 | 5 | 0 |
| 16 | 350 | NG(−) | 250 | 68 | 13 | 19 | 0 | 100 | 0 |
| 17 | 350 | NG(−) | 300 | 22 | 32 | 46 | 0 | 97 | 3 |
| 18 | 350 | 0.25 | 180 | 59 | 5 | 36 | 5 | 20 | 75 |
| 19 | 350 | 0.3 | 320 | 11 | 46.5 | 42.5 | 0 | 5 | 95 |
| 20 | 350 | 0.34 | 240 | 38 | 40 | 22 | 0 | 5 | 95 |
| 21 | 350 | 0.7 | 200 | 72 | 6 | 22 | 30 | 60 | 10 |

| No | Coating thickness (μm) | Corrosion resistance | Corrosion resistance after processing | Alkali corrosion resistance | Coating adhesion after processing | Abrasion resistance | Remarks |
|---|---|---|---|---|---|---|---|
| 1 | 5 | C− | D | B | C+ | B | CF |
| 2 | 5 | C | C− | B | C | B | CF |
| 3 | 5 | C+ | D | C | C− | B | CF |
| 4 | 5 | D | D | B | C+ | B | CF |
| 5 | 5 | D | D | D | C− | D | CF |
| 6 | 5 | D | D | C− | C− | D | CF |
| 7 | 5 | C | D | B | C− | B | CF |
| 8 | 5 | B | C− | A | B | A | CF |
| 9 | 5 | A | D | B | B | A | CF |
| 10 | 5 | A | C | C− | B | A | CF |
| 11 | 5 | C | C− | B | A | C− | CF |
| 12 | 5 | D | D | D | A | D | CF |
| 13 | 5 | D | D | C | A | D | CF |
| 14 | 5 | A | A | B | A | A | EX |
| 15 | 5 | A | C− | A | B | A | CF |
| 16 | 5 | A | C− | A | D | A | CF |
| 17 | 5 | A | C− | C | D | A | CF |
| 18 | 5 | C | C | A | A | C− | CF |
| 19 | 5 | C− | D | D | A | C− | CF |
| 20 | 5 | C | C− | D | A | C− | CF |
| 21 | 5 | A | A | B | B | A | EX |

TABLE 2

| No | Substrate temperature (° C.) | Particle diameter of quasi-crystalline phase (μm) | Thickness of interfacial alloy layer (nm) | Zn (% by mass) | Al (% by mass) | Mg (% by mass) | MgZn$_2$ phase (% by volume) | Quasi-crystalline phase (% by volume) | Balance structure (% by volume) |
|---|---|---|---|---|---|---|---|---|---|
| 22 | 400 | 0.98 | 490 | 72 | 6 | 22 | 30 | 60 | 10 |
| 23 | 500 | NG (3) | 1000 | 72 | 6 | 22 | 30 | 60 | 10 |
| 24 | 300 | 0.2 | 250 | 66 | 15 | 19 | 90 | 10 | 0 |
| 25 | 300 | 0.25 | 240 | 68 | 14 | 18 | 70 | 30 | 0 |
| 26 | 300 | 0.3 | 230 | 72 | 10 | 18 | 50 | 50 | 0 |
| 27 | 300 | 0.5 | 200 | 74 | 8 | 18 | 30 | 70 | 0 |
| 28 | 300 | 1 | 230 | 75.5 | 6.3 | 18.2 | 15 | 85 | 0 |
| 29 | 300 | 0.05 | not more than 100 nm | 68 | 14 | 18 | 70 | 30 | 0 |
| 30 | 300 | 0.1 | not more than 100 nm | 68 | 14 | 18 | 70 | 30 | 0 |
| 31 | 300 | 0.2 | 210 | 72.4 | 7.2 | 20.5 | 70 | 20 | 10 |
| 32 | 300 | 0.3 | 200 | 75 | 6 | 19 | 50 | 40 | 10 |
| 33 | 300 | 0.7 | 220 | 75 | 5 | 20 | 30 | 60 | 10 |
| 34 | 300 | 0.9 | 190 | 78 | 3 | 19 | 10 | 80 | 10 |
| 35 | 300 | 0.1 | 490 | 72 | 7 | 21 | 70 | 5 | 25 |
| 36 | 300 | 0.2 | 200 | 74 | 6 | 20 | 50 | 20 | 30 |
| 37 | 300 | 0.3 | 190 | 76 | 4 | 20 | 30 | 40 | 30 |
| 38 | 300 | 0.6 | 180 | 78 | 3 | 19 | 10 | 60 | 30 |
| 39 | 300 | 0.9 | 300 | 52 | 38.5 | 9.5 | 0 | 82 | 18 |
| 40 | 300 | 1 | 280 | 69 | 25 | 6 | 0 | 85 | 15 |
| 41 | 15 | 0.5 | not more than 100 nm | 68 | 13 | 19 | 0 | 55 | 45 |
| 42 | 200 | 0.3 | 200 | 54 | 42 | 4 | 7 | 3 | 90 |
| 43 | 400 | 1 | 450 | 54 | 42 | 4 | 20 | 8 | 72 |

| No | Coating layer thickness (μm) | Corrosion resistance | Corrosion resistance after processing | Alkali corrosion resistance | Coating adhesion after processing | Abrasion resistance | Remarks |
|---|---|---|---|---|---|---|---|
| 22 | 5 | A | A | B | B | A | EX |
| 23 | 5 | A | C− | B | D | A | CF |
| 24 | 5 | A | C− | B | C | A | CF |
| 25 | 5 | A | B | B | C+ | A | EX |
| 26 | 5 | A | A | B | C+ | A | EX |
| 27 | 5 | A | C | B | C− | A | CF |
| 28 | 5 | A | C− | B | C− | A | CF |
| 29 | 0.05 | D | D | D | C− | C | CF |
| 30 | 0.1 | C+ | C | C+ | C+ | C+ | EX |
| 31 | 5 | A | C− | B | B | A | CF |
| 32 | 5 | A | A | B | B | A | EX |
| 33 | 5 | A | A | A | B | A | EX |
| 34 | 5 | A | C− | A | B | A | CF |
| 35 | 10 | B | C− | B | B | A | CF |
| 36 | 5 | B | C− | A | B | A | CF |
| 37 | 5 | A | A | A | B | A | EX |
| 38 | 5 | A | A | A | B | A | EX |
| 39 | 5 | A | C− | C | C | A | CF |
| 40 | 5 | A | C− | B | C | A | CF |
| 41 | 5 | C+ | D | C | D | C | CF |
| 42 | 3 | D | D | C | D | D | CF |
| 43 | 9 | B | D | B | D | C− | CF |

From the results shown in Table 1 and Table 2, it has become clear that the samples of No. 14, 21, 22, 25, 26, 30, 32, 33, and 37 to 38 are superior in corrosion resistance, corrosion resistance after processing, alkali corrosion resistance, coating adhesion after processing, and abrasion resistance.

When the temperature of a substrate is high, the coating adhesion after processing tends to decrease due to growth of an interfacial alloy layer, further at a high temperature, a crystal grain grows and the crystal grain diameter tends to increase.

FIG. 3 shows an electron beam diffraction image of an area, which was identified as an area of a quasicrystalline phase through cross-sectional TEM observation of the No. 34 specimen in Table 1. Since as shown in FIG. 3 a radial regular-decagonal electron beam diffraction image derived from an icosahedral structure was obtained, it has been confirmed that a quasicrystalline phase was precipitated in the sample.

INDUSTRIAL APPLICABILITY

According to the above embodiment of the present disclosure, a coated steel with dramatically improved corrosion resistance (especially corrosion resistance after processing), alkali corrosion resistance, and abrasion resistance when used in the fields of building material, automobile, household electrical appliance, etc. may be provided. Therefore, a longer operating life of a component compared to a conventional surface treated steel may be achieved.

The entire contents of the disclosures by Japanese Patent Application No. 2015-191856 are incorporated herein by reference.

All the literature, patent application, and technical standards cited herein are also herein incorporated to the same extent as provided for specifically and severally with respect to an individual literature, patent application, and technical standard to the effect that the same should be so incorporated by reference.

The invention claimed is:

1. A coated steel comprising a steel, a coated metal layer coated on a surface of the steel, and an interfacial alloy layer formed at the boundary between the steel and the coated metal layer,
wherein the composition of the coated metal layer comprises in terms of % by mass Zn from 20 to 83%, and Al from 2.5 to 46.5% as well as Mg and impurities as the balance, wherein the Mg content is 10% or more,
wherein the structure of the coated metal layer comprises a quasicrystalline phase, a $MgZn_2$ phase, and a balance structure, wherein the area fraction of the quasicrystalline phase is from 30 to 60%, and not less than 90 number-% of the quasicrystalline phases are a quasicrystalline phase having a particle diameter in the major axis direction of from 0.05 to 1.0 μm,
wherein the area fraction of the structure of the coated metal layer is determined from a cross-section cut in the thickness direction of the coated metal layer, and
wherein the thickness of the coated metal layer is 0.1 μm or more, and the thickness of the interfacial alloy layer is 500 nm or less.

2. The coated steel according to claim 1, wherein the area fraction of the balance structure is 40% or less.

3. The coated steel according to claim 1, wherein the thickness of the coated metal layer is from 0.1 to 10 μm.

4. The coated steel according to claim 1, wherein the coated metal layer is a vapor deposited coated metal layer.

5. The coated steel according to claim 1, wherein the interfacial alloy layer is an Al—Fe alloy layer.

6. The coated steel according to claim 1, wherein the coated metal layer comprises one, or two or more kinds of selective elements out of C, Ca, Si, Ti, Cr, Fe, Co, Ni, V, Nb, Cu, Sn, Mn, Sr, Sb, Pb, Y, Cd, or La, and the total content of all the selective elements combined is from 0.5% by mass or less.

* * * * *